United States Patent [19]

Pham

[11] 4,215,424
[45] Jul. 29, 1980

[54] DESCRIPTIVE RESUME RANDOM ACCESS STATIC MEMORY ELEMENT

[75] Inventor: Ngu T. Pham, Paris, France

[73] Assignee: Thomson-CSF, Paris, France

[21] Appl. No.: 2,308

[22] Filed: Jan. 10, 1979

[30] Foreign Application Priority Data

Jan. 13, 1978 [FR] France ............................... 78 00933

[51] Int. Cl.² ............................................. G11C 11/40
[52] U.S. Cl. .................................... 365/174; 307/238; 365/179; 365/181; 357/36
[58] Field of Search ................ 307/238, 249; 365/179, 365/174, 175, 181; 357/36, 38

[56] References Cited

U.S. PATENT DOCUMENTS 3,781,828  12/1973  Platt et al. ............................. 365/179

Primary Examiner—Terrell W. Fears
Attorney, Agent, or Firm—Cushman, Darby & Cushman

[57] ABSTRACT

A random access memory element, fed by a constant current source, contains two complementary transistors forming a pnpn or npnp structure, with a lateral transistor and a transverse transistor. The constant current source is connected to an emitter of the lateral transistor, which is at a distance from its collector. This transistor has a second emitter near this collector, this second emitter receiving a control voltage which is able to trigger the assembly.

10 Claims, 7 Drawing Figures

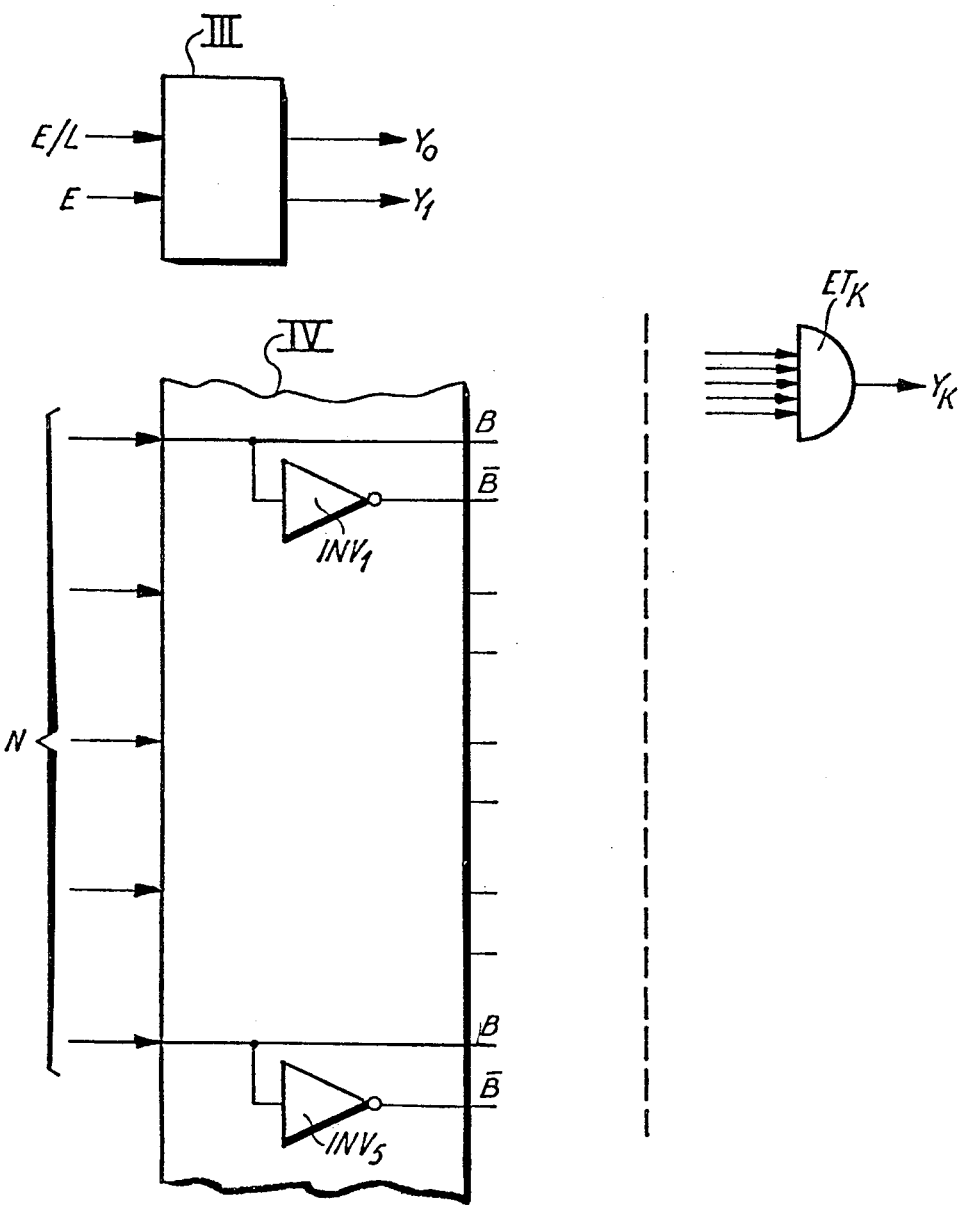

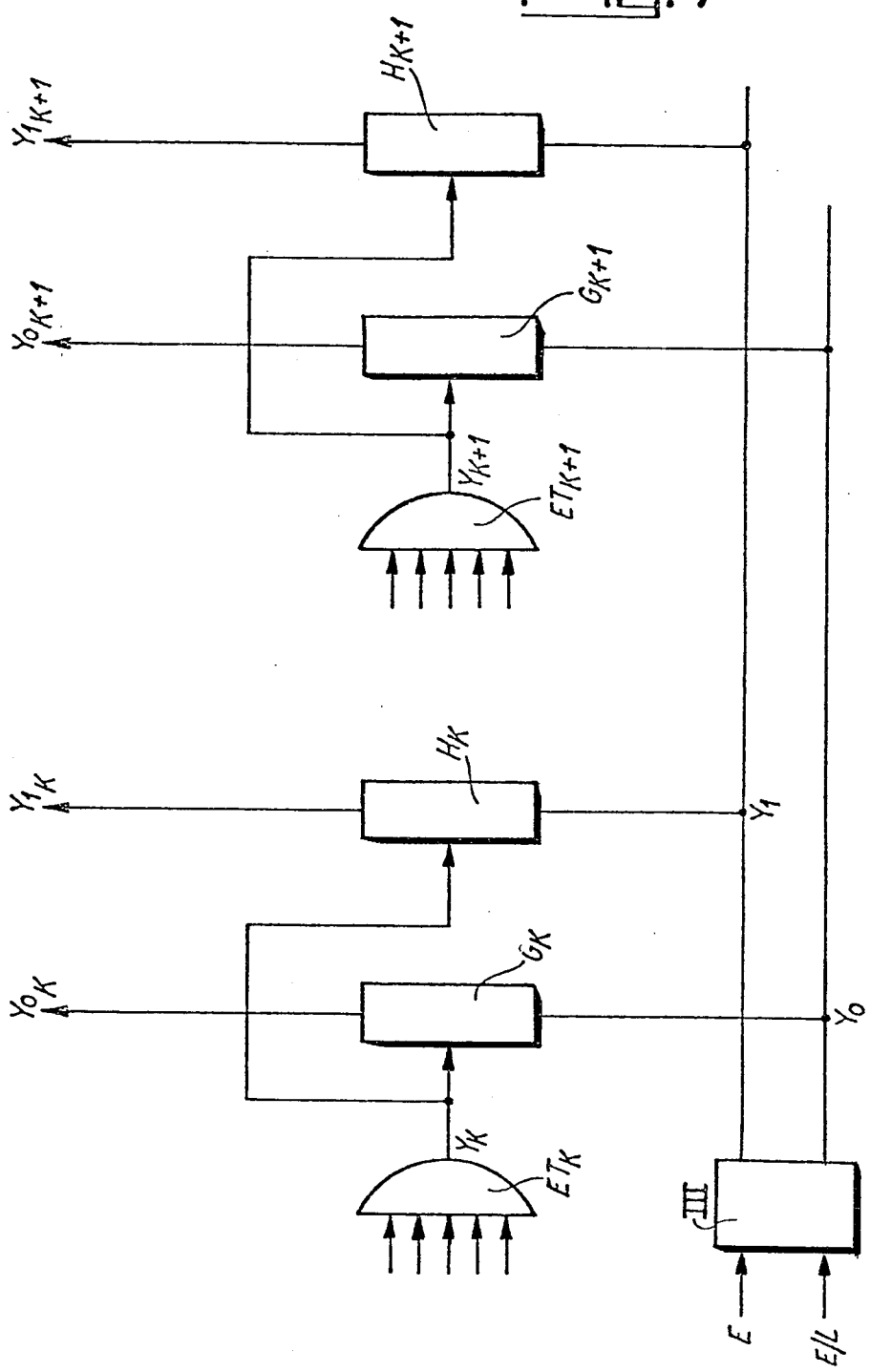

DESCRIPTIVE RESUME RANDOM ACCESS STATIC MEMORY ELEMENT

Random access static memories consist of matrices of active elements with two stable states, one corresponding to the "0" state and the other to the "1" state. The addressing of each element for reading or writing is done by selection of the line and column at whose intersection is the element addressed.

The performance of each type of memory depend mainly on the stability and dimensions of each element.

The invention covers a memory element which can have a very small surface area and be easily integrated thus enabling memories with a high integration density to be obtained.

The memory element in accordance with the invention contains a first and a second complementary transistor integrated on the same substrate, the collector of the first transistor forming the base of the second while the base of the first is the collector of the second; it is mainly characterized by the fact that the first transistor has a first emitter at some distance from its collector and a second emitter near the same collector, the first emitter being connected to a constant current source, Y addressing being done on the second emitter and X addressing on the emitter of the second transistor.

Figure 1:
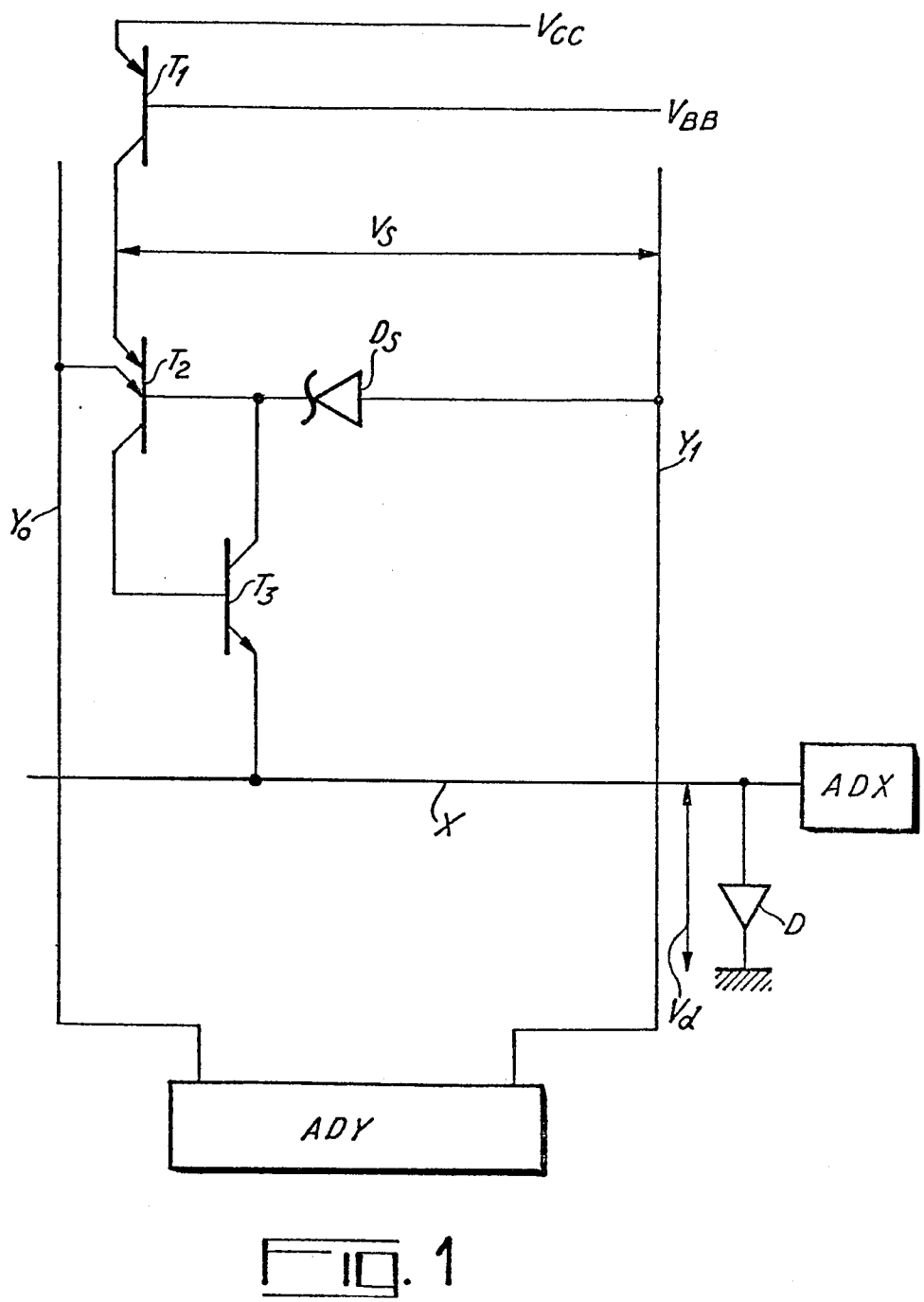
Figure 2:
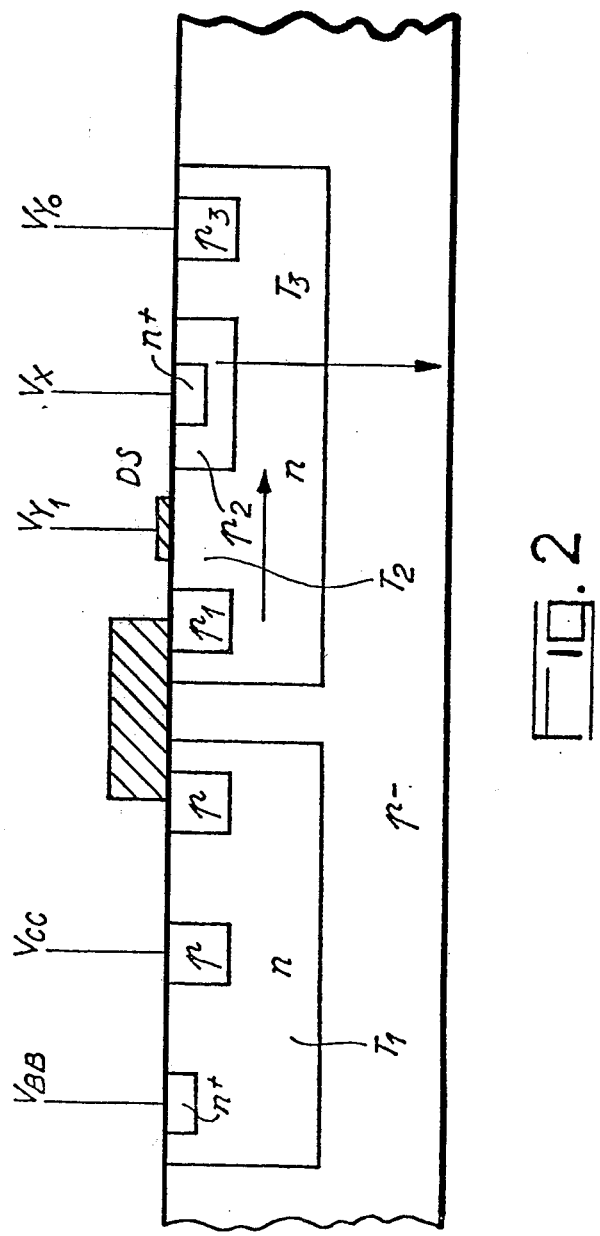
Figure 3:
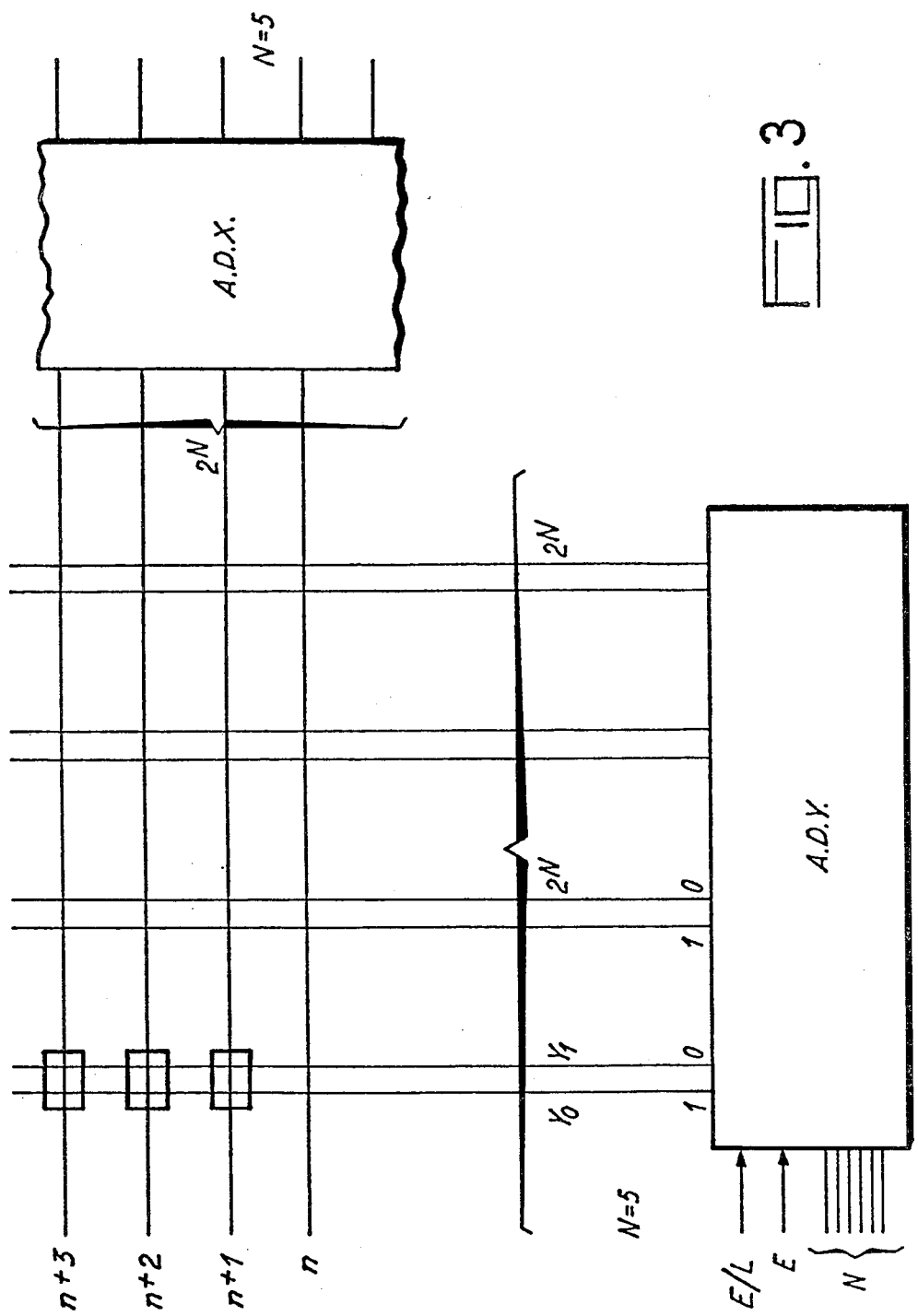
Figure 4:
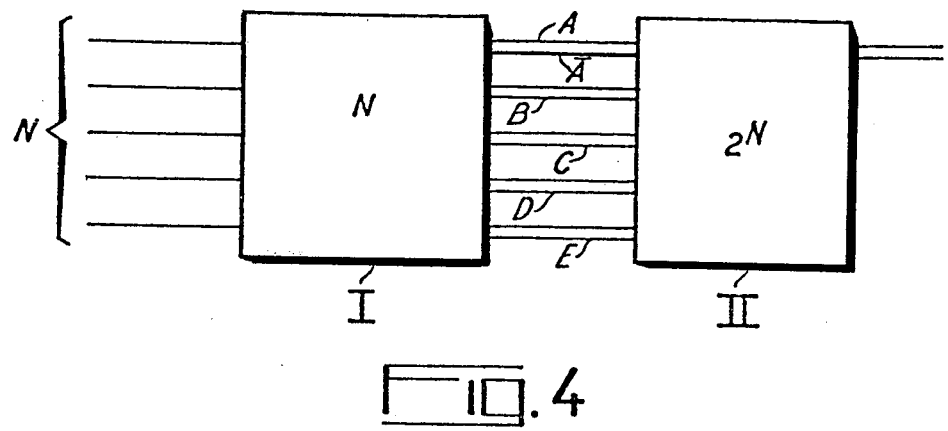
Figure 5:
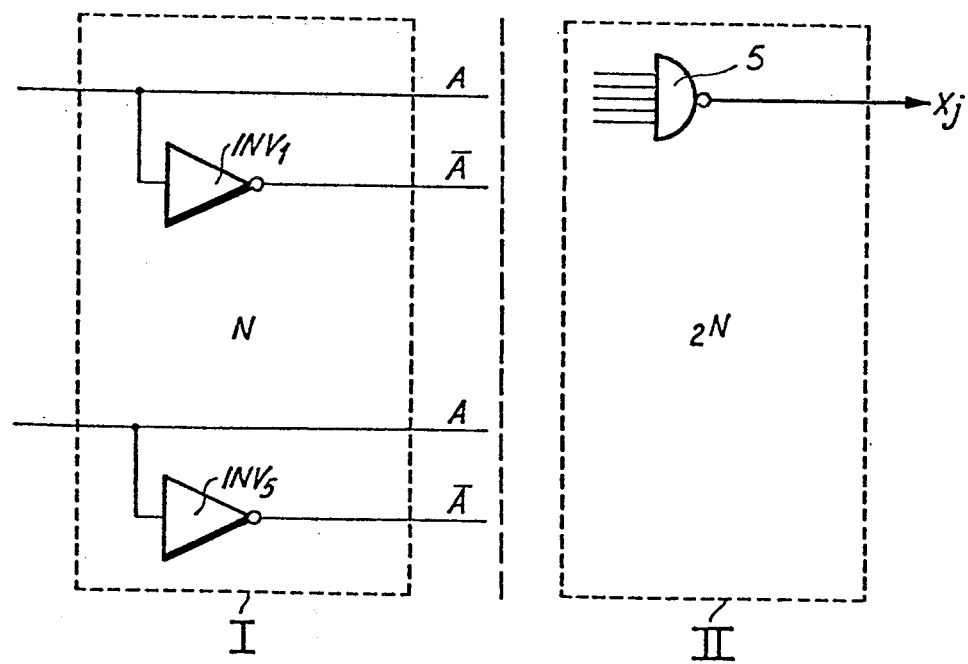

The invention will be better understood by means of the following description with reference to the drawings attached among which:

FIG. 1 is the schematic diagram of the memory element in accordance with the invention, FIG. 2 is a sectional view of this element, integrated on a substrate, FIG. 3 shows the schematic diagram of a memory containing elements in accordance with the invention, FIG. 4 is a schematic diagram of an X addressing device, FIG. 5 is a more detailed schematic diagram of this last device, FIG. 6 is a schematic diagram of a Y addressing device, FIG. 7 is a detail of the device in FIG. 6.

In FIG. 1 there are three transistors $T_1$, $T_2$ and $T_3$. The first transistor $T_1$, a pnp type one, has its base and emitter raised to fixed potential, $V_{BB}$ and $V_{CC}$ respectively and operates therefore as a current source.

Its collector is connected to a first emitter of transistor $T_2$ of the same pnp type. Another emitter of the same transistor, much nearer the collector, is connected to the first addressing line $Y_0$ while its base is series connected with a Schottky diode to another addressing line $Y_1$, the two lines being connected to the same addressing device ADY. This base is also connected to the collector of transistor $T_3$, an npn type one, the base of the latter being connected to the collector of transistor $T_2$ while its emitter is connected to the X addressing line. This line is connected to ground by a diode D forward biassed from the X line to ground on the one hand and to the X addressing device on the other, the main purpose of the latter being to short-circuit the diode and ground the X line. The two devices ADX and ADY will be described later on.

When the lines $Y_0$ and $Y_1$ are not addressed, their potential is floating. When line $Y_0$ is addressed, it is raised to a fixed potential $V_{Y0}$. When line $Y_1$ is addressed, it may be raised to a fixed potential (potential $V_{Y1}$).

When line X is not addressed, it is at 0.8 V (the voltage drop at the terminals of diode D). When it is addressed, it is grounded (potential "0").

It is known that assembly $T_2$-$T_3$ may have two stable states, one conducting or "passing" and the other blocked the two states representing the states "0" and "1" by convention respectively.

The structure is shown in a transverse section, integrated on the same substrate. Transistor $T_2$, a pnp type, with its two emitter $p_1$ and $p_3$, can be clearly seen, $p_1$ being at a distance from the collector p and $p_3$ near it. Voltage $Y_1$ is applied to a metallic zone DS, which forms a Schottky diode with the base n and is between the emitter and collector. Transistors $T_1$ and $T_2$-$T_3$ are in two n type bowes made by known means in the p type substrate. The emitter of $T_2$ is connected to the collector of transistor $T_1$.

It can be seen that the system $p_1$ $np_2$ $n^+$ has a base controlled by the relatively big Schottky diode DS. The transistor $p_1$ $np_2$ has a very low gain and the structure cannot therefore switch from one state to the other without external influence. However, the system $p_3$ $np_2$ $n^+$ can be switched by action on the emitter $p_3$. It is this emitter which is connected to addressing line $Y_0$. Once in the passing state, even unaddressed, the system remains in the passing state thanks to the current supplied by the current source formed by transistor $T_1$.

The following table recapitulates the possible states of the cell in which:

$V_{Xoff}$ is the voltage of $V_X$ when the cell is not adressed (here 0.8 V, the voltage at the terminals of forward biassed diode D), $V_{Xon}$ is the addressing voltage on line X (here $V_{Xon}=0$), $V_d$ is the voltage at the diode terminals when it is passing, $V_s$ is the voltage at the Schottky diode terminals when it is conductive, $V_{Y0}$ is the voltage applied to line $Y_0$ to trigger the cell to the "0" state (cell passing), $V_{Y1}$ is the voltage applied to line $Y_1$ to trigger the cell to the "1" state (cell cut off).

The initial conditions are:

$$V_{Y0} - V_{Xoff} < V_d, \tag{1}$$

$$V_{Y1} - V_{Xoff} < V_s. \tag{2}$$

These two conditions are the stability conditions in the blocking and unblocking states respectively of the cell when it is not addressed.

In the present case, $V_{Xoff} = V_d$.

These conditions can be written:

$$V_{Y0} < 2V_d \tag{1}$$

$$V_{Y1} < V_d + V_s \tag{2}$$

The following two conditions are those for triggering to the "1" and "0" states respectively:

$$V_{Y0} - V_{Xon} > V_d$$

$$V_{Y1} - V_{Xon} > V_s$$

or, as $V_{Xon} = 0$ $$V_{Y0} > V_d$$

$V_{Y1} > V_s$

It can be seen that, to act on a cell, it is necessary to ground $V_X$, which affects a line of the memory matrix, and change the cell state using one of the two lines $Y_0$ and $Y_1$ when they have been addressed.

When voltage $V_{Y0}$ is applied to line $Y_0$ the cell is triggered to the "0" state, [equation (3),] or kept in this state, if $V_{Y0} < 2V_d$, equation (1).

In the same way, when voltage $V_{Y1}$ is applied to line $Y_1$, it is triggered to the "1" state (cut off) if $V_{Y1} > V_s$ and kept in this state if $V_{Y1} < V_s + V_d$. Reading occurs when voltage $X_{on}$ is applied to the line selected and lines $Y_0$ and $Y_1$ are addressed. Reading is the measurement of the output voltage on line $Y_1$.

In the "0" state, assembly $T_2$–$T_3$ is conductive and line $Y_1$ is at "0" potential.

In the "1" state, the assembly is blocked, line $Y_1$ is disconnected from the fround and its potential different from "0".

FIG. 3 shows the schematic diagram of a random access memory using memory elements in accordance with the invention.

The elements are in X lines and Y columns.

Each X line (only the lines of ranks n, n+1, n+2 and n+3 respectively are shown here) is connected to the X addressing system ADX, which has $2^N$ outputs and N inputs, N being a whole number and $2^N$ the number of lines.

Each Y column contains two connection lines $Y_{1K}$ and $Y_{0K}$.

The pairs of columns, $2^N$ in number, are connected to the Y addressing system ADY, which has N inputs and two additional inputs, one the input E/L which assigns alternately the functions of writing and reading the data in the selected element and the other E which switches lines $Y_0$ to a a voltage $V_{Y0}$ to write a "0" or line $Y_1$ to a voltage $V_{Y1}$ to write a "1". There are N addressing inputs, $e_1, \ldots e_N$.

Operation of the assembly can easily be understood. For device ADX, one line of the matrix is sensitized, i.e. all its elements, and only they, are able to receive data, their line being grounded.

Input E/L tells device ADY the function it is to ensure, reading or writing.

In both cases a column is chosen. Hence only the element at the crossing point of the line selected by device ADX and the column selected by ADY is able to store the "1" or "0" data or read out it in accordance with the instruction received through input E/L.

In the case in which a storing instruction is given, it store the "0" or "1" state depending on the voltage at input E. For reading out, it delivers the data it contains in accordance with the procedure described above.

FIG. 4 shows the schematic diagram of device ADX.

It contains N logic inverters grouped in block I and $2^N$ gates grouped in assembly II.

To make the explanation easier, N=5 has been used and this gives $2^5 = 32$ inverters.

The inverters are mounted as indicated in FIG. 5. As a result, two complementary outputs A and $\overline{A}$ correspond to each input of assembly I.

Assembly II contains 32 NAND gates whose respective outputs switch to the "0" state when the 5 inputs are in the "1" state. Each of these gates bears a rank from 0 to 31.

For each line A or $\overline{A}$, by definition one of them A or $\overline{A}$ is raised to level 1. Also, each number from 0 to 31 in binary notation is a five figure number, each figure being 1 or 0. For example, 3 is written 00011.

To energize gate 3, it is sufficient to connect it to lines $\overline{A}$, $\overline{B}$ and $\overline{C}$ which are at level 1 to lines D and E which are also at level 1, since A, B and C are at level 0.

Hence, it is clear that, to obtain the address of line $X_j$, it suffices to apply the figures which form the number j j to the inputs of the assembly to obtain line $X_j$ and, as a result, the selection of a line in the matrix.

This being so, the problem to be solved is the selection of one element of line $X_j$ and that of column $Y_K$ either to write in data or read out the data it contains. This is made by the system ADY which will be described by means of the following figures.

The block diagram of the addressing device is shown in FIG. 6. It contains two main organs, one control organ III and one addressing organ IV. Organ IV is identical to organs I and II in FIG. 4 except that to each column corresponds an AND circuit whose output is triggered to the "1" state when all its inputs are in the "1" state.

The operation of this organ will be explained with reference to FIG. 7.

Control organ III has two inputs, input E/L which controls the data write in or read out function and input E which, for writting in, controls the entry of a "0" or a "1". It has two "bus" outputs $Y_0$ and $Y_1$ which are connected to each column of the matrix as will be seen in FIG. 7.

Input E is connected to a voltage source with two levels "0" and "1".

When it is in the "1" state, it raises line $Y_1$ to potential $V_{Y1}$ and, when it is in the "0" state, it raises the potential of line $Y_0$ to $V_{Y0}$. Input E/L in the L position enables the data contained in the element addressed to be read out.

Assembly IV for Y addressing is identical to assembly ADX except that the inverters control AND gates with five inputs which switch to the "1" state when all the inputs are in the "1" state and remain at "0" when this is not so.

In FIG. 7, the AND gates, one for each column, each control two switches, $G_K$ and $H_K$, which, when they are in the "1" position, connect lines $Y_0$ and $Y_1$ respectively to lines $Y_{OK}$ and $Y_{1K}$ which are assigned to each column of the matrix.

It follows that writting in or reading out only occur in each column when the corresponding gate is open.

It is evident that all these logic assemblies can be made using bipolar transistor integrated circuits; in particular, an assembly may contain complementary pnp and npn transistor flip-flops such as those used in each element of the memory.

What we claim is:

1. A random access memory element comprising a first and a second complementary transistor, integrated upon the same substrate, and having respective collectors, bases and emitters, said collector of said first transistor and said base of said second transistor being constituted by a first semiconducting region, said base of said first transistor and said collector of said second transistor, being constituted by a second semiconducting region forming a rectifying junction with said first region, said first transistor having a further emitter having connection means to constant current and being at a distance from said collector substantially higher than that of said emitter, said emitter of said first transistor having connection means to a first Y addressing device, and said emitter of said second collector having connection to a first Y addressing device.

2. An element as claimed in claim 1, wherein said first transistor is of the lateral type, said second transistor being of the transverse type.

3. An element as claimed in claim 2, wherein a first Schottky diode is formed by a rectifying metal contact on said base of said first transistor between said further emitter and said collector, X addressing means being capable of connecting said rectifying contact to the ground.

4. An element as claimed in claim 3, wherein a second Schottky diode is constituted by a metal rectifying contact formed upon said base of said first transistor, between said emitter and said collector said first Y addressing means being capable of triggering said element from the conductor to the blocked state, said states being respectively significant of the "0" or of the "1" state, a second Y addressing means being connected to said second diode said second addressing being capable of triggering said element to the "0" state, and of readout the information stored by said element.

5. A random access memory made of a matrix of elements as claimed in claim 4.

6. A memory as claimed in claim 5, comprising $2^N$ lines and $2^N$ columns.

7. A memory as claimed in claim 6, wherein each X and Y addressing means comprising N inputs capable of being carried to the "0" or "1" level, the respective levels of said N inputs forming in binary notation, one of the integer numbers from 0, to $2^N-1$, and $2^N$ outputs, each output being formed of two pairs, the digit manifested by the outputs of each pair being complementary to each other.

8. A memory as claimed in claim 7, wherein said addressing means comprise associated with each of its N input, a logic inverter, said input being directly connected to one of the output of the pair and by means of said inverter to the other output.

9. A memory as claimed in claim 8, wherein said X addressing means comprise $2^N$ NAND logic gates, having respective outputs connected respectively to the $2^N$ lines of the matrix, each of said inverter having N inputs connected to respectively to said output pairs.

10. A memory as claimed in claim 9, wherein said Y addressing means further comprises two bus lines carrying respectively the "0" or the "1" level, a logic circuit for controlling said bus lines, said logic circuit having a first input for controlling the writing the "0" or the reading out the "0" and the "1", a second input for writing the "1", a second input for writing the "1" and $2^N$ AND logic circuits having respective inputs connected to said output pairs and $2^N$ outputs respectively capable of connecting said bus lines to said columns of said matrix.

* * * * *